United States Patent [19]

Aguirre et al.

[11] Patent Number: 4,823,358

[45] Date of Patent: Apr. 18, 1989

[54] HIGH CAPACITY ELECTRON BEAM COLD HEARTH FURNACE

[75] Inventors: Carlos E. Aguirre, Downingtown; Howard R. Harker, Malvern, both of Pa.

[73] Assignee: 501 Axel Johnson Metals, Inc., Lioville, Pa.

[21] Appl. No.: 225,228

[22] Filed: Jul. 28, 1988

[51] Int. Cl.[4] .............................................. H01J 37/305
[52] U.S. Cl. ......................................... 373/10; 373/16;
164/506; 164/512
[58] Field of Search .................. 164/506, 512; 373/10,
373/11, 15, 16

[56] References Cited

U.S. PATENT DOCUMENTS 3,342,250 9/1967 Treppschuh et al. ................. 373/16
4,728,772 3/1988 Smith ..................................... 373/11
4,730,661 3/1988 Stephan ................................ 164/506

Primary Examiner—Roy N. Envall, Jr.
Attorney, Agent, or Firm—Brumbaugh, Graves, Donohue & Raymond

[57] ABSTRACT

In the particular embodiment of an electron beam furnace arrangement described in the specification, an electron beam gun unit is supported on rails for motion between two hearth and casting units, each having a lid to seal the unit when the electron beam gun unit is not in place. Sealing covers are also provided for the molds associated with the casting units. A common pump, preheating and hearth cooling unit communicates with each of the hearth and casting units so that, when one of the hearth and casting units is in use, the other unit can be cleaned and maintained and then outgassed and preheated in preparation for transfer of the electron beam gun unit from the other hearth and casting unit.

12 Claims, 1 Drawing Sheet

HIGH CAPACITY ELECTRON BEAM COLD HEARTH FURNACE

BACKGROUND OF THE INVENTION

This invention relates to electron beam cold hearth furnaces and, more particularly, to a new and improved electron beam furnace having a high capacity.

In electron beam cold hearth refining of metals, a solid skull of the metal being refined is formed on the surface of the cold hearth. Moreover, during the refining and casting operation, spattered drops of molten metal solidify on the walls and other interior surfaces of the hearth. Consequently, whenever there is a change in the composition of the material being refined, the furnace must be shut down, cooled and opened to permit thorough cleaning of the interior surfaces so as to avoid contamination of the next batch of material to be refined. The time required to effectuate such changes includes not only the time involved in cooling, removing the skull and cleaning the furnace and then re-establishing the necessary high vacuum for electron beam operation, but also the time involved in outgassing the interior of the furnace, which usually requires many hours.

Furthermore, even if the same product is being refined continuously, it is necessary to change condensate collection screens within the furnace periodically to avoid build-up of condensate which can catch fire during venting of the furnace for a maintenance cycle and thereby damage furnace components.

Because of these considerations, the maximum production time which can be expected with conventional electron beam cold hearth furnaces is no more than about 40%, the balance of the time being required for maintenance work, set-up and start-up for each new refining run and handling of material being supplied to or removed from the furnace. In view of the high cost of electron beam furnaces, it would be economically advantageous to increase the production time for such furnaces.

SUMMARY OF THE INVENTION

Accordingly, it is an object of the present invention to provide a new and improved electron beam cold hearth furnace which overcomes the above-mentioned disadvantages of the prior art.

Another object of the invention is to provide a high-capacity electron beam cold hearth furnace in which substantially continuous melting, refining and casting operations can be carried out.

These and other objects of the invention are attained by providing a furnace having at least two separately operable hearth and casting units and an electron beam unit which can be mounted alternately on the two hearth and casting units, each of the hearth and casting units being provided with a removable lid to permit evacuation and preheating in the absence of the electron beam unit. Preferably, separate raw material feed units are movable to selectively communicate with either of the hearth and casting units and two or more feed units may be provided to supply one or both of the hearth and casting units at the same time. In addition, a common pump and preheating unit may be arranged to evacuate each hearth and casting unit, both before and during a refining operation with an electron beam unit. To permit continuous removal of ingots, the hearth and casting units may each have two separate molds, along with sealing lids which can be positioned to seal off the mold which is not being used for casting.

BRIEF DESCRIPTION OF THE DRAWINGS

Further objects and advantages of the invention will be apparent from a reading of the following description in conjunction with the accompanying drawings in which.

DESCRIPTION OF PREFERRED EMBODIMENTS

Figure 1:
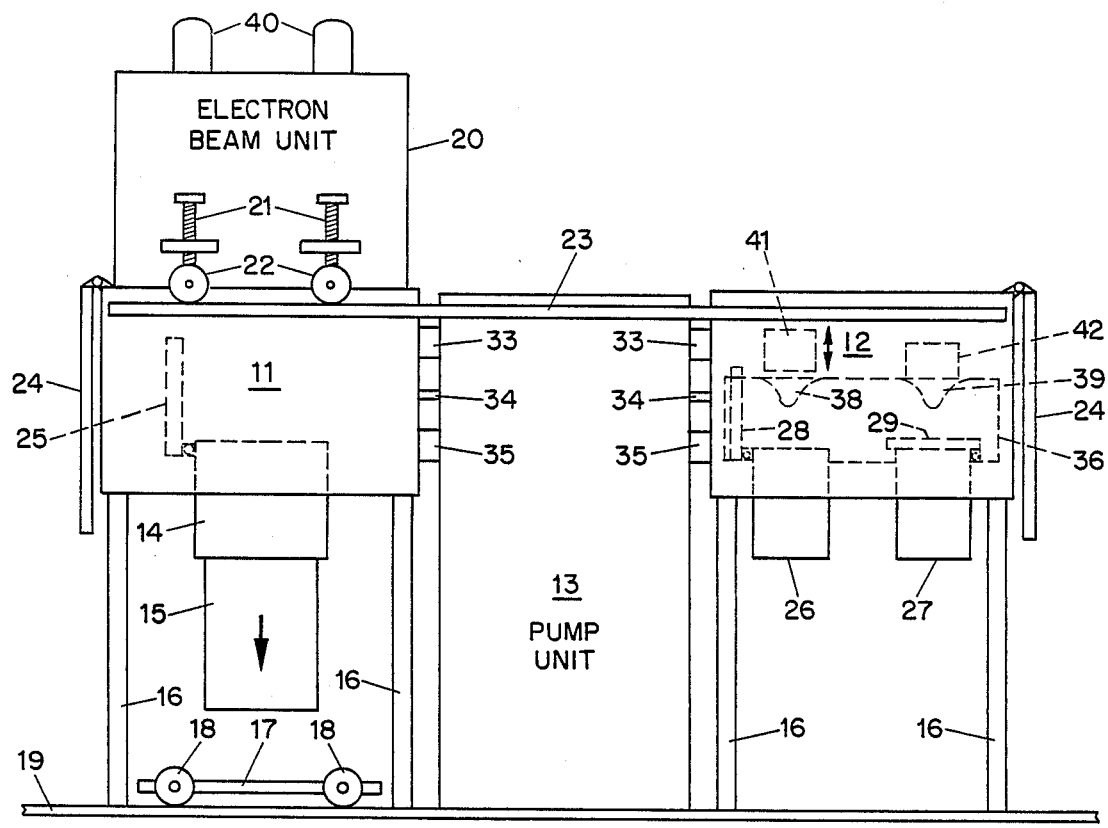
FIG. 1 is a schematic elevation view illustrating a representative cold hearth refining furnace arranged in accordance with the invention.

In the typical embodiment of the invention shown in the drawings, a cold hearth electron beam furnace has two hearth and casting units 11 and 12 disposed on opposite sides of a common pump, preheating and hearth-cooling unit 13. The hearth and casting unit 11 has a vertical mold 14 through which an ingot 15 is withdrawn downwardly in the usual manner, the hearth and casting unit 11 being supported by legs 16 to provide space for the downward withdrawal and removal of the ingot 15 in the usual manner. For this purpose, a dolly 17 supported by wheels 18 on a pair of rails 19 is arranged to remove the ingot 15 rapidly from the vicinity of the furnace.

An electron beam unit 20 having six electron beam guns 40 is mounted on the hearth and casting unit 11 in the condition of the furnace shown in the drawings. Four jacks 21 are provided so that the electron beam gun unit 20 may be separated from the hearth and casting unit 11 and supported by four wheels 22 on two rails 23 mounted on the opposite ends of the hearth and casting units 11 and 12. In this way, the electron beam gun unit 20 may be moved selectively on the rails 23 into operating positions with respect to the hearth and casting units 11 and 12, respectively. Alternatively, the gun unit 20 may be moved by an overhead crane. Each of the hearth and casting units 11 and 12 also has a hinged lid 24 which may be pivoted into position over the opening which receives the electron beam gun unit 20 to seal the hearth and casting unit for evacuation when the electron beam gun unit is not mounted on that hearth and casting unit. In addition, the mold 14 of the hearth and casting unit 11 is provided with a hinged cover 25, and the hearth and casting unit 12, which has two molds 26 and 27, has corresponding covers 28 and 29 for the same purpose.

To supply raw material to each of the hearth and casting units 11 and 12 selectively, two feed units 30 and 31 are mounted on rails 32 so that they are movable between the units 11 and 12 and may be brought into sealing engagement with those units selectively. The common pump, preheating and hearth-cooling unit 13, located between the two hearth and casting units 11 and 12, includes vacuum pumps for evacuating the hearth and casting units 11 and 12 and is arranged to communicate through vacuum lines 33 connected to those units to the feed units 30 and 31 to evacuate those units before they are opened to supply raw material to the hearth and casting units. In addition, the pump unit 13 supplies electrical power through lines 34 to preheat the hearth units to a temperature close to the operating temperature in preparation for mounting of the electron beam gun unit 20 and operation of the gun unit to melt and refine raw material in the hearth unit. The pump unit 13 also includes a circulation system connected through lines 35 for cooling the hearth beds in the hearth units 11 and 12 and the molds 14, 26 and 27 in the usual manner.

Figure 2:
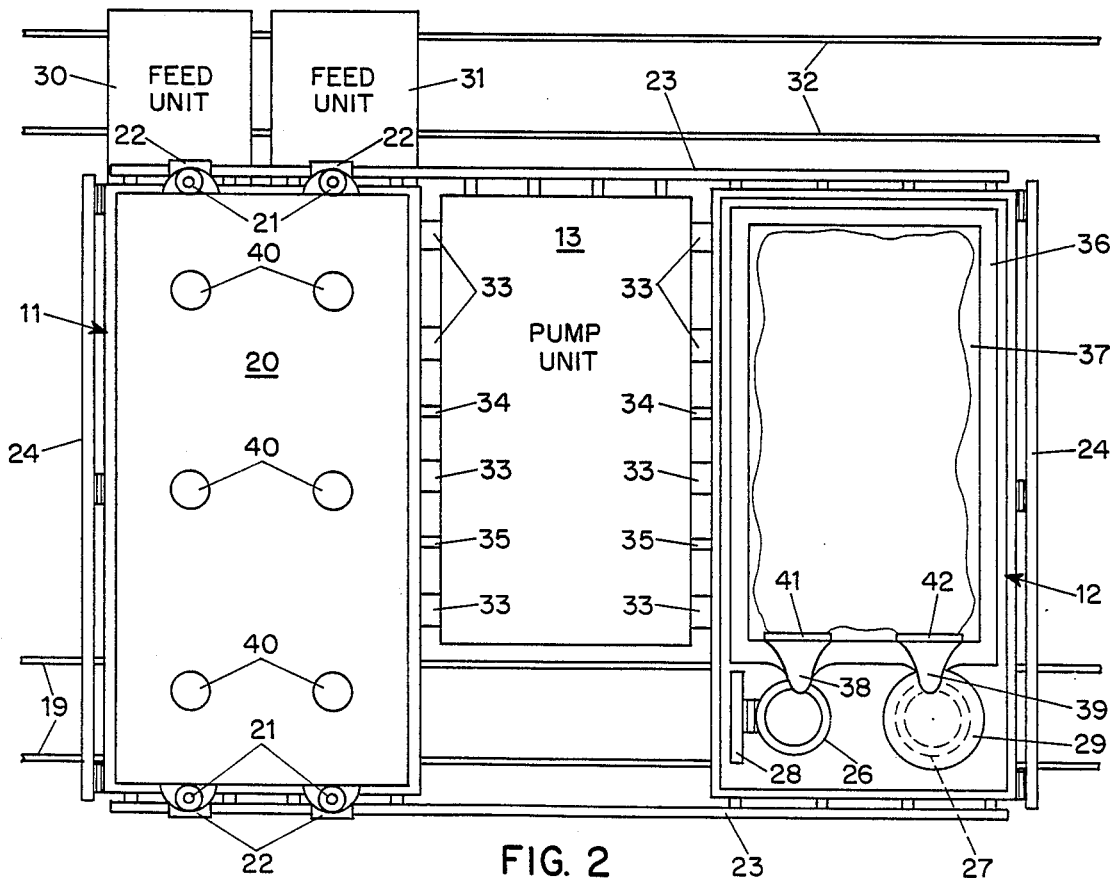
FIG. 2 is a plan view of the typical furnace arrangement illustrated in FIG. 1.

FIG. 2, which illustrates the arrangement of the hearth and casting unit 12 with the lid 24 open, shows a hearth bed 36 in which a skull 37 has been formed, along with pouring spouts 38 and 39 from which molten material is poured from the hearth bed 36 into the molds 26 and 27 during operation. The hearth and casting unit 11 is similarly arranged, except that only one pouring spout is provided. In each case, the lids 25, 28 and 29 are hinged for motion in two axes to permit them to be moved from the open position to the closed position without interference from the spout. It will be understood, of course, that the hearth and casting unit 11 may include multiple molds similar to those of the unit 12 if desired, and that the unit 12 may, if desired, have only a single mold, such as in the casting unit 11. When multiple molds are provided, dams 42 and 43 are movable into position to shut off the flow of molten material to the spouts 38 and 39, respectively, as shown in FIG. 2. Thus, casting of material in one of the molds can continue while the other mold is closed for removal of the ingot. Alternatively, the molten metal at the unused pour spout is allowed to freeze and stop the flow.

In operation, with the furnace arranged in the manner shown in FIGS. 1 and 2 with the electron beam gun unit 20 lowered into sealed communication with the hearth and casting unit 11 and a mold plug (not shown) disposed in the mold 14 in the usual manner, the combined gun unit 20, hearth and casting unit 11 and feed units 30 and 31 are evacuated by the pumps in the unit 13 to the reduced pressure required for operation of the electron beam guns 40. Raw material is supplied from the feed units 30 and 31 to the hearth bed in the unit 11 and melted by directed electron beams in the unit 20 to form a molten pool of metal in the hearth bed. Since the hearth bed is cooled by liquid supplied from the unit 13, a skull of solid material is formed on the hearth bed, protecting the bed from degradation and protecting the molten material from contamination.

Thereafter, the molten material is cast in the usual manner into an ingot 15 which moves downwardly in the mold 14 as the molten material flows through the hearth. When one of the feed units 30 and 31 is empty, the connection between that unit and the hearth unit 11 is sealed and the feed unit is opened to receive a further charge of raw material, after which it is closed and evacuated by the pump unit 13 before the connection to the hearth unit is reopened so that raw material can be supplied.

After an ingot 15 has been completed, supply of raw material from the feed units is suspended and the mold cover 25 is positioned over the mold to seal the hearth and casting unit before the ingot 15 is withdrawn from the mold 14 and removed by the dolly 17. The mold plug (not shown) is then replaced in the mold 14. The cover 25 is removed from the mold and the supply of raw material from the feed units 30 and 31 is resumed. In this manner, the hearth and casting unit 11 may be used in a substantially continuous manner without interruption to cast a series of ingots 15 having the same composition.

After extensive use of a hearth and casting unit in this manner, however, the furnace must be shut down for maintenance and cleaning. Continued production during maintenance and cleaning of the hearth and casting unit 11 is effected by shifting the electron beam gun unit 20 into position on the hearth and casting unit 12. In preparation for this during the operation of the unit 11, the unit 12 has been cleaned and any necessary maintenance accomplished and then preheated and outgassed by closing the hearth lid 24 and the mold covers 28 and 29 and evacuating the unit with the pumps in the pump unit 13. In this connection, outgassing of a hearth unit that has been opened for an extended period of time requires a long time, which may be up to 8 or 10 hours. When the unit has been opened to the air for only a relatively short time, such as the 10 or 20 minutes required to mount the electron beam unit 20, the subsequent outgassing may be accomplished in a relatively short time, such as less than an hour.

When the gun unit 20 is shifted from the hearth and casting unit 11 to the hearth and casting unit 12, the feed units 30 and 31 are also shifted into position to supply raw material to the hearth unit 12 and, having been filled with the appropriate raw material, are evacuated by pumps in the pump unit 13 concurrently with the evacuation of the hearth and casting unit 12.

When the hearth and casting unit 12 has been outgassed, raw material from the feed units 30 and 31 is introduced and melted to form a skull in the manner previously described in connection with the operation of the hearth unit 11. Thereafter, the raw material is supplied continuously and melted and refined in the hearth and then cast into ingots in the molds 26 and 27 in a continuous manner, the feed units being replenished as necessary as described in connection with the operation of the hearth unit 11.

With this unique furnace arrangement, the total down time between operation with the two hearths may be limited to about one to two hours and the down time between casting of successive ingots even with a single mold may be less than 10 minutes. Assuming shutdown of each hearth for maintenance or repair after about three days of operation and assuming a total of six hours during that period is required for initial outgassing and start-up of production in the hearth, as well as removal of ingots, production times greater than 60% are possible. In this way, with a relatively modest increase in the cost of the furnace resulting from the installation of a second hearth and casting unit, production time for an electron beam furnace can be increased by more than 50%, for example, from about 40% to more than 60%, depending on the length of the production runs for materials having the same composition.

Although the invention has been described herein with reference to a specific embodiment, many modifications and variations therein will readily occur to those skilled in the art. Accordingly, all such variations and modifications are included within the intended scope of the invention.

We claim:

1. An electron beam furnace arrangement comprising first hearth means for receiving raw material to be melted and refined, second hearth means spaced from the first hearth means for receiving raw material to be melted and refined, each of the first and second hearth means having removable lid means, electron beam gun means adapted to be mounted in sealed relation with each of the first and second hearth means selectively, and pump- means for evacuating each of the first and second hearth means when either the electron beam gun means or the lid means is positioned in sealing relation with the hearth means.

2. An electron beam furnace arrangement in accordance with claim 1 wherein each hearth means includes vertical mold means for casting ingots of material refined in the hearth means and cover means for covering the mold means to permit evacuation of the hearth means.

3. An electron beam furnace arrangement in accordance with claim 1 including feed means selectively movable into sealed relation with the first and second hearth means for supplying raw material thereto.

4. An electron beam furnace arrangement in accordance with claim 3 including rail means for supporting and guiding the feed means between the first and second hearth means.

5. An electron beam furnace arrangement in accordance with claim 3 wherein the feed means includes at least two feed units movable between the first and second hearth means.

6. An electron beam furnace arrangement in accordance with claim 1 including vertical ingot-casting mold means associated with each of the first and second hearth means and conveyor means for receiving ingots from the mold means of the first and second hearth means and conveying them away from the hearth means.

7. An electron beam furnace arrangement in accordance with claim 6 including rail means for supporting the conveyor means for transporting ingots away from the hearth means.

8. An electron beam furnace arrangement in accordance with claim 1 including preheating and evacuating means for preheating and evacuating either of the hearth means prior to mounting of the electron beam gun means on the hearth means.

9. An electron beam furnace arrangement in accordance with claim 1 wherein each of the hearth means comprises a cold hearth adapted to receive cooling liquid and including common cooling means for supplying cooling liquid to the first and second hearth means.

10. An electron beam furnace arrangement in accordance with claim 1 including rail means connected between the first and second hearth means and roller means for transporting the electron beam gun means between the first and second hearth means.

11. An electron beam furnace arrangement in accordance with claim 1 wherein at least one of the hearth means includes at least two mold means for casting ingots and means for selectively directing molten material from the hearth means to each of the mold means.

12. An electron beam furnace arrangement in accordance with claim 11 including cover means for sealing each of the mold means and dam means for selectively controlling the flow of molten material to each of the mold means to permit withdrawal of an ingot from one of the mold means while casting an ingot in the other mold means.

* * * * *